US012568596B2

(12) United States Patent
Hong et al.

(10) Patent No.: US 12,568,596 B2
(45) Date of Patent: Mar. 3, 2026

(54) DISPLAY CONTROL MODULE AND DISPLAY APPARATUS COMPRISING SAME

(71) Applicant: LG ELECTRONICS INC., Seoul (KR)

(72) Inventors: Daewoon Hong, Seoul (KR); Sangtae Park, Seoul (KR); Myeongwook Bae, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 270 days.

(21) Appl. No.: 18/026,940

(22) PCT Filed: Sep. 27, 2021

(86) PCT No.: PCT/KR2021/013119
§ 371 (c)(1),
(2) Date: Mar. 17, 2023

(87) PCT Pub. No.: WO2022/085964
PCT Pub. Date: Apr. 28, 2022

(65) Prior Publication Data
US 2024/0306317 A1 Sep. 12, 2024

(30) Foreign Application Priority Data

Oct. 23, 2020 (KR) ........................ 10-2020-0138226

(51) Int. Cl.
*H05K 5/30* (2025.01)
*G09F 9/30* (2006.01)
(Continued)

(52) U.S. Cl.
CPC .............. *H05K 5/30* (2025.01); *G09F 9/301* (2013.01); *G09F 9/302* (2013.01); *H05K 5/0226* (2013.01); *H01L 25/0753* (2013.01)

(58) Field of Classification Search
CPC ........ H05K 5/30; H05K 5/0226; G09F 9/301; G09F 9/302; G09F 9/33; G09F 13/22; G09F 9/3026; H01L 25/0753; G09G 3/32
See application file for complete search history.

(56) References Cited

U.S. PATENT DOCUMENTS 5,337,502 A * 8/1994 Hopkins ............. G09F 15/0006
40/605
5,990,802 A * 11/1999 Maskeny .............. G09F 9/3026
345/82
(Continued)

FOREIGN PATENT DOCUMENTS

KR 10-2016-0109057 A 9/2016
KR 10-2016-0141009 A 12/2016
(Continued)

*Primary Examiner* — Allen L Parker
*Assistant Examiner* — Martin Antonio Asmat Uceda
(74) *Attorney, Agent, or Firm* — Birch, Stewart, Kolasch & Birch, LLP

(57) ABSTRACT

A display apparatus according to an embodiment may output an image, wherein a plurality of display modules are spaced apart from and connected to each other on an external surface. To this end, the display apparatus comprises: a support member of which one end is fixed to the external surface; a pair of display modules that are fixed to the other end of the support member with the support member therebetween; and a PCB which is provided at the other end of the support member to control at least one of the pair of display modules, wherein the pair of display modules may be supported by the support member and spaced apart from each other on the external surface.

17 Claims, 16 Drawing Sheets

(51) Int. Cl.
  *G09F 9/302* (2006.01)
  *H01L 25/075* (2006.01)
  *H05K 5/02* (2006.01)

(56) References Cited

U.S. PATENT DOCUMENTS

| | | | | |
|---|---|---|---|---|
| 6,741,222 B1 * | 5/2004 | Tucker | G09F 9/33 | 345/1.1 |
| 7,086,188 B2 * | 8/2006 | Tsao | G09F 9/33 | 40/503 |
| 7,682,043 B2 * | 3/2010 | Malstrom | G09F 9/3026 | 362/147 |
| 7,694,444 B2 * | 4/2010 | Miller | H05K 7/183 | 40/448 |
| 7,770,314 B2 * | 8/2010 | Dean | G09F 15/0012 | 248/221.11 |
| 7,864,516 B2 * | 1/2011 | Lee | G09F 9/33 | 345/1.3 |
| 8,111,208 B2 * | 2/2012 | Brown | G09F 9/3026 | 345/55 |
| 8,350,788 B1 * | 1/2013 | Nearman | G09F 27/008 | 345/82 |
| 8,384,616 B2 * | 2/2013 | Elliott | F21V 21/005 | 345/82 |
| 9,058,755 B2 * | 6/2015 | Cope | F21V 23/008 | |
| 9,416,551 B2 * | 8/2016 | Hall | G09F 21/04 | |
| 9,854,701 B2 * | 12/2017 | Choi | F16M 11/043 | |
| 9,898,240 B2 * | 2/2018 | Williams | G09F 9/33 | |
| 10,030,853 B2 * | 7/2018 | Andreasen | F21V 19/004 | |
| 10,066,785 B1 * | 9/2018 | Chen | F16M 11/14 | |
| 10,152,293 B2 * | 12/2018 | Patterson | G09F 9/3026 | |
| 10,753,531 B2 * | 8/2020 | Huang | F16M 11/08 | |
| 10,818,206 B2 * | 10/2020 | Shibata | G09F 19/226 | |
| 11,023,195 B2 * | 6/2021 | Kwon | G09F 9/302 | |
| 11,183,087 B1 * | 11/2021 | Timmins | H05K 5/0204 | |
| 11,470,731 B1 * | 10/2022 | Hochman | F16M 11/22 | |
| 11,543,074 B1 * | 1/2023 | Sears | F16M 11/2014 | |
| 11,783,738 B2 * | 10/2023 | Zhang | G09F 9/3026 | 345/204 |
| 11,841,569 B2 * | 12/2023 | Fan | G02F 1/13336 | |
| 11,882,379 B2 * | 1/2024 | Bremmon | A47B 97/001 | |
| 2007/0000849 A1 * | 1/2007 | Lutz | G09F 9/33 | 211/26 |
| 2007/0001927 A1 * | 1/2007 | Ricks | G09F 9/3026 | 345/1.1 |
| 2008/0266206 A1 * | 10/2008 | Nelson | G09F 9/3026 | 345/1.3 |
| 2011/0101185 A1 * | 5/2011 | Kitaguchi | F16M 13/02 | 248/222.14 |
| 2012/0062540 A1 * | 3/2012 | Quadri | G09F 9/3026 | 345/82 |
| 2016/0048047 A1 * | 2/2016 | Pyo | G02B 5/3083 | 359/488.01 |
| 2020/0058238 A1 * | 2/2020 | Davis | G09F 11/025 | |
| 2022/0415217 A1 * | 12/2022 | Zhang | G09G 3/20 | |
| 2023/0019566 A1 * | 1/2023 | Wang | H05K 5/0217 | |

FOREIGN PATENT DOCUMENTS

| | | | | | |
|---|---|---|---|---|---|
| KR | 10-2018-0032117 A | 3/2018 | | | |
| KR | 10-2018-0090173 A | 8/2018 | | | |
| KR | 20180090173 A | * | 8/2018 | | G09F 9/3026 |
| WO | WO-2005060478 A2 | * | 7/2005 | | G09F 23/0066 |

* cited by examiner

DISPLAY CONTROL MODULE AND DISPLAY APPARATUS COMPRISING SAME

CROSS REFERENCE TO RELATED APPLICATIONS

This application is the National Phase of PCT International Application No. PCT/KR2021/013119, filed on Sep. 27, 2021, which claims priority under 35 U.S.C. 119(a) to Patent Application No. 10-2020-0138226, filed in the Republic of Korea on Oct. 23, 2020, all of which are hereby expressly incorporated by reference into the present application.

TECHNICAL FIELD

The present disclosure relates to a display control module that controls a display module and a display device including the same.

BACKGROUND

There are various types of display modules that implement images. For example, there are various display modules such as a liquid crystal display panel (LCD), a light emitting diode display panel (LED), a plasma display panel (PDP), and an organic light emitting display panel (OLED). In addition, a film-type display module that implements the images is known. A transparent and flexible film-type display module may be implemented.

In one example, a display device may be divided into a model manufactured as a finished product in a factory and a module manufactured in a module unit in a factory and finally assembled at the site. In the display device for the on-site assembly, a display module and a display control module for controlling the display may be separately manufactured. The display device for the on-site assembly installed as the film-type display module and the display control module are attached to a surface of a glass window or the like is known.

SUMMARY

Technical Problem

A purpose of the present disclosure according to one embodiment is to improve convenience of on-site installation of a display device.

Another purpose of the present disclosure according to one embodiment is to fix a display module based on window glasses connected to each other in various structures.

Another purpose of the present disclosure according to one embodiment is to improve continuity of an output image by continuously fixing display modules.

Furthermore, another purpose of one embodiment of the present disclosure is to solve various problems not mentioned herein. This will be understood by a person skilled in the art via the entire meaning of the present document and drawings.

Technical Solutions

To achieve the above purpose, a display device according to one embodiment includes a support member having one end fixed to an exterior target surface, a pair of display modules fixed to the other end of the support member with the support member therebetween, and a PCB disposed at the other end of the support member so as to control at least one of the pair of display modules, and the pair of display modules are supported by the support member so as to be spaced apart from the exterior target surface.

In addition, according to one embodiment, the support member may include a first fixing portion forming the one end of the support member and fixed to the exterior target surface, a second fixing portion forming the other end of the support member, wherein the pair of display modules are fixed to the second fixing portion, and a connecting portion for connecting the first fixing portion and the second fixing portion to each other.

In addition, according to one embodiment, the second fixing portion may include an extension member extending along at least one of both sides so as to support rear surfaces of the pair of display modules fixed to the second fixing portion.

In addition, according to one embodiment, the second fixing portion may include spacing adjustment means for adjusting a spacing between the pair of display modules fixed to the second fixing portion.

In addition, according to one embodiment, the connecting portion may further include a hinge portion capable of changing an angle formed by the first fixing portion and the second fixing portion.

In addition, according to one embodiment, the second fixing portion may extend in one direction, and each pair of display modules may be fixed to each second fixing portion along the one direction.

In addition, according to one embodiment, the first fixing portion may include a plurality of first fixing portions along the one direction of the second fixing portion.

In addition, according to one embodiment, the pair of display modules may include a plurality of LEDs arranged to be spaced apart from each other at a preset spacing, and the support member may have a width smaller than or equal to the preset spacing.

In addition, according to one embodiment, the pair of display modules may include a first display module disposed on one side of the other end of the support member, and a second display module disposed on the other side of the other end of the support member, and a spacing between an LED closest to the support member in the first display module and an LED closest to the support member in the second display module may be the preset spacing.

To achieve the above purpose, a display control module according to one embodiment includes a support member having one end fixed to an exterior target surface and the other end fixed to a pair of display modules, and a PCB disposed at the other end of the support member so as to control at least one of the pair of display modules, and the support member supports the pair of display modules so as to be spaced apart from the exterior target surface.

In addition, according to one embodiment, the support member includes a first fixing portion forming the one end of the support member and fixed to the exterior target surface, a second fixing portion forming the other end of the support member, wherein the pair of display modules are fixed to the second fixing portion, and a connecting portion for connecting the first fixing portion and the second fixing portion to each other.

In addition, according to one embodiment, the second fixing portion may include an extension member extending along at least one of both sides so as to support rear surfaces of the pair of display modules fixed to the second fixing portion.

In addition, according to one embodiment, the second fixing portion may include spacing adjustment means for adjusting a spacing between the pair of display modules fixed to the second fixing portion.

In addition, according to one embodiment, the connecting portion may further include a hinge portion capable of changing an angle formed by the first fixing portion and the second fixing portion.

In addition, according to one embodiment, the second fixing portion may extend in one direction, and each pair of display modules may be fixed to each second fixing portion along the one direction.

In addition, according to one embodiment, the first fixing portion may include a plurality of first fixing portions along the one direction of the second fixing portion.

Advantageous Effects

The present disclosure according to one embodiment may improve the convenience of the on-site installation of the display device.

The present disclosure according to one embodiment may fix the display module based on the window glasses connected to each other in the various structures.

The present disclosure according to one embodiment may improve the continuity of the output image by continuously fixing the display modules.

BRIEF DESCRIPTION OF THE DRAWINGS

FIG. 6 is a cross-sectional view of S2-S2' in FIG. 2.

DETAILED DESCRIPTION

Figure 1:
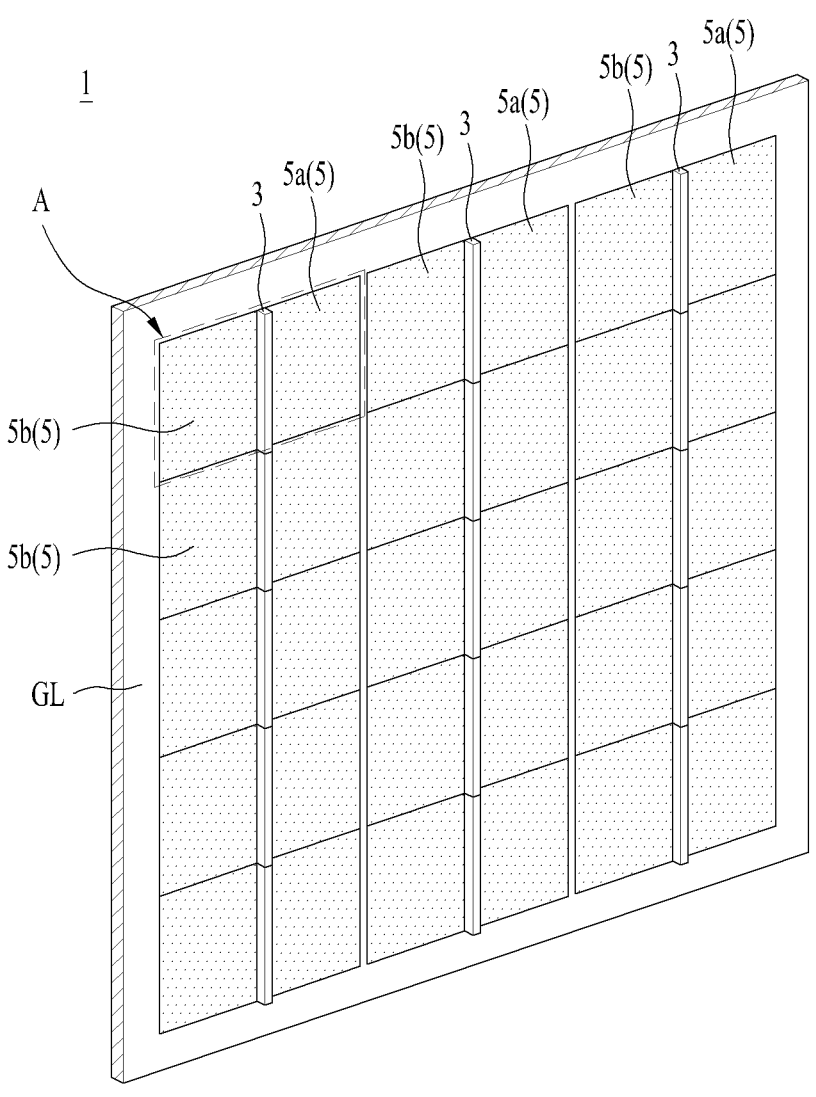
FIG. 1 is a perspective view of a display device according to an embodiment of the present disclosure.

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The present disclosure may be described on the basis of a spatial orthogonal coordinate system with an X-axis, a Y-axis, and a Z-axis orthogonal to each other. Each axial direction (an X-axis direction, a Y-axis direction, or a Z-axis direction) means both directions in which each axis extends. Adding a '+' sign in front of each axial direction (a +X-axis direction, a +Y-axis direction, or a +Z-axis direction) means a positive direction, which is one of the two directions in which each axis extends. Adding a '−' sign in front of each axial direction (a −X-axis direction, a −Y-axis direction, or a −Z-axis direction) means a negative direction, which is the other of the two directions in which each axis extends.

A display device described herein is a concept including all display devices that display information with a unit pixel or a set of unit pixels. Therefore, the term 'display device' may be applied not only to finished products but also to parts. For example, a panel corresponding to one part of a digital TV independently corresponds to the display device herein. The finished products may include a mobile phone, a smart phone, a laptop computer, a terminal for digital broadcasting, a personal digital assistant (PDA), a portable multimedia player (PMP), a navigation device, a slate PC, a tablet PC, an Ultra Book, a digital TV, and a desktop computer.

However, those skilled in the art will readily recognize that a configuration according to an embodiment described herein may be applied to a device capable of displaying, even in a form of a new product to be developed later. In addition, a semiconductor light emitting element mentioned herein is a concept including an LED, a micro LED, and the like, and is able to be interchangeably used therewith.

FIG. 1 is a perspective view of a display device according to an embodiment of the present disclosure.

A display device 1 according to an embodiment of the present disclosure includes a display module 5 for displaying an image. The display module 5 is coupled to an exterior target surface GL. The display device 1 includes a display control module 3 that controls image output of the display module 5. The display control module 3 controls power and image signal supply to the display module 5. The display control module 3 is coupled to the exterior target surface.

The display device 1 according to an embodiment of the present disclosure may include a plurality of display modules 5. The plurality of display modules 5 may be arranged at regular spacings to output one continuous image. The display control module 3 may be disposed between the display modules 5 to fix and support the display module 5 and control the power and the image signal applied to the display module 5.

Figure 2:
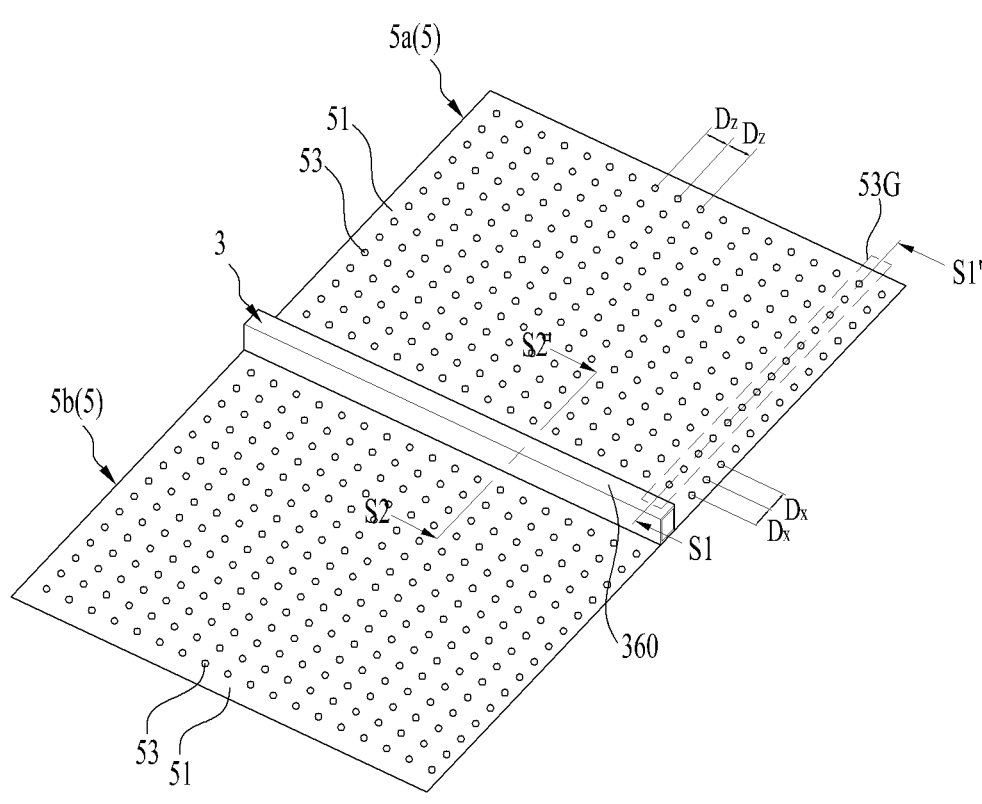
FIG. 2 is a partial enlarged view of a display device according to an embodiment of the present disclosure.

FIG. 2 is a partial enlarged view of a display device according to an embodiment of the present disclosure. Specifically, FIG. 2 is an enlarged view of a configuration A in FIG. 1. In this regard, the configuration A may be a unit configuration constituting the display device 1.

The display device 1 according to an embodiment of the present disclosure may include a pair of display modules 5 on both sides of the display control module 3 at a center. The pair of display modules 5 may include a first display module 5*a* disposed on one side of the display control module 3 and a second display module 5*b* disposed on the other side.

The display module 5 may be an LED module. As another example, the display module 5 may be a liquid crystal display (LCD) module. As another example, the display module 5 may be one of a plasma display panel (PDP), a field emission display (FED) module, an organic light emitting display (OLED) module, and a micro LED display module. Hereinafter, the display module 5 is described as being the LED module, but is not necessarily limited thereto.

The display module 5 may be formed to be flexible. The display module 5 may be formed of a film-type. The display module 5 may be formed to be transparent. Because the display module 5 is transparent, light from one LED 53 may be irradiated in both directions (forward and rearward directions).

The display module 5 may include a film 51 on which the LEDs 53 and circuit wiring are disposed. The LEDs 53 may be arranged on the film 51 at preset spacings Dx and Dz. In this regard, the LEDs 53 may be arranged on the film 51 in line with rows and columns. Specifically, in display module 5, the LEDs arranged along each row form one array group 53G, and a plurality of array groups 53G may be arranged along the column.

The display control module 3 may include a PCB that controls the display module 5. The PCB connected to the display module 5 may be mounted inside a casing 360.

Figure 3:
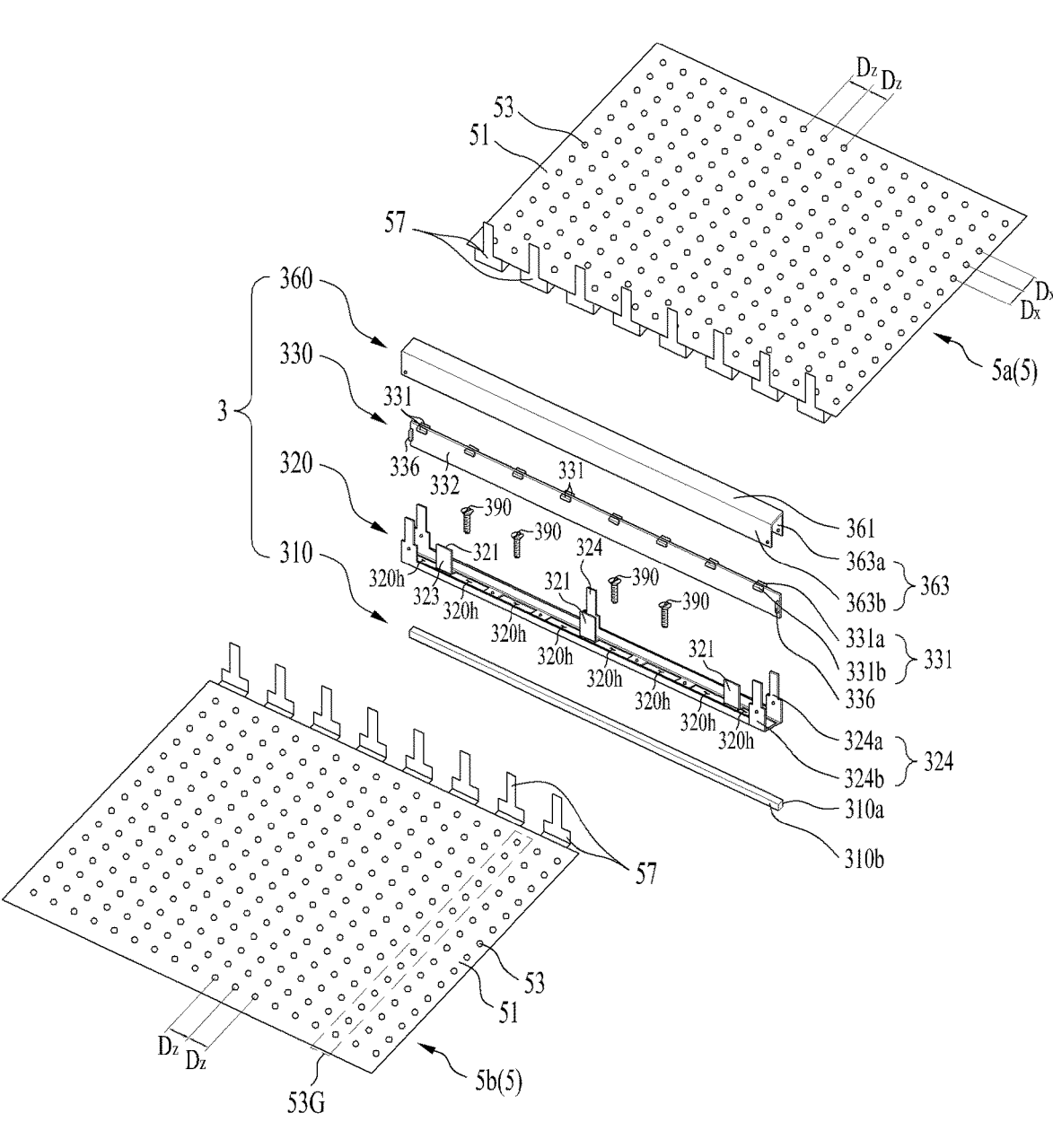
FIG. 3 is an exploded view of FIG. 2.
Figure 4:
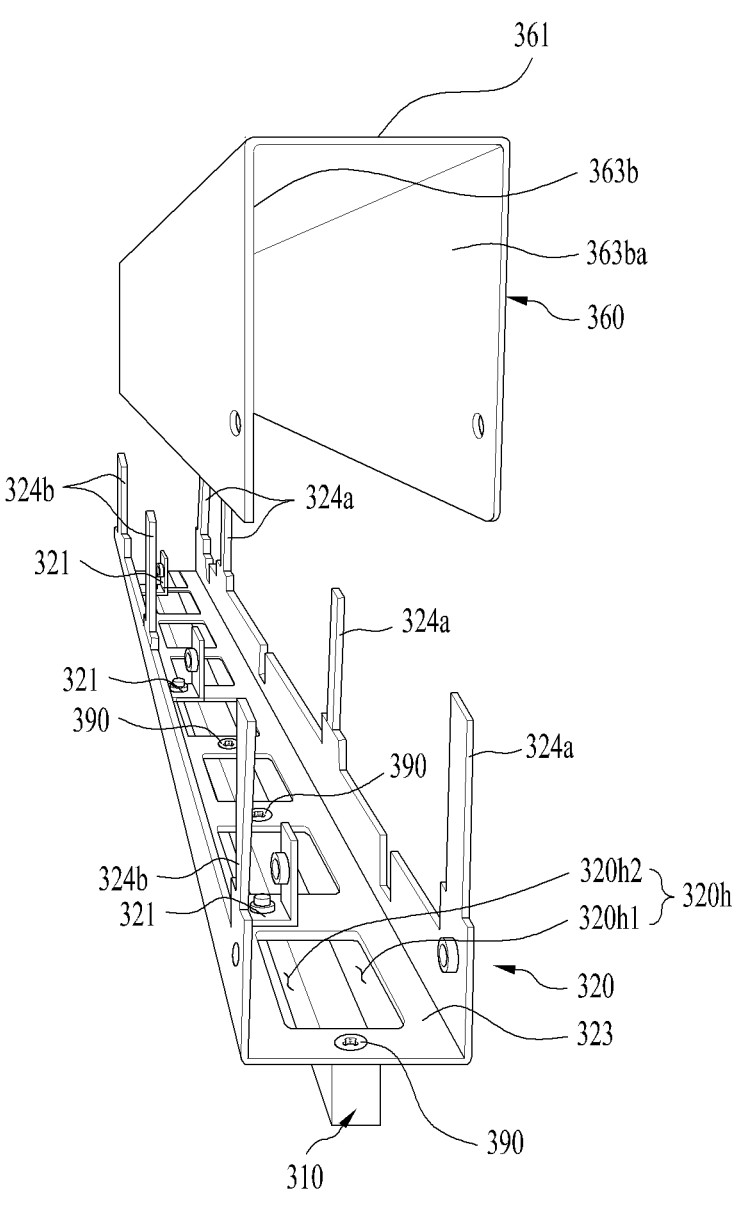
FIG. 4 is an enlarged perspective view of a partial configuration in FIG. 2.

FIG. 3 is an exploded view of FIG. 2. FIG. 4 is an enlarged perspective view of a partial configuration in FIG. 2. Hereinafter, description of the same component refers to the description of the previous drawings.

The display module 5 may be electrically connected to the display control module 3 with a connection interface 57 disposed on one side. The display module 5 may receive at least one of the power and the image signal applied via the connection interface 57.

The display control module 3 may include a guide 310 disposed between the first display module 5*a* and the second display module 5*b*. The guide 310 may extend in one direction, and the first display module 5*a* and the second display module 5*b* may be respectively disposed on both sides of the guide 310.

The display control module 3 may include a base 320 fixed to the guide 310 and coupled to the casing 360 to define an accommodation space in which a PCB 330 may be accommodated. The base 320 may include a PCB coupled portion 321 for fixing the PCB 330, a cover 323 fixed to the guide 310, and a casing guide 324 coupled to the casing 360.

The guide 310 may be fixed to one surface of the cover 323, and the PCB coupled portion 321 may be included on the other surface of the cover 323. Specifically, a fastening member 390 may extend through the cover 323 of the base 320 and be fixed to the guide 310.

The casing guides 324 may be included on both sides of the cover 323. Specifically, the casing guides 324 may include a first casing guide 324*a* protruding at the side of the first display module 5*a* and a second casing guide 324*b* protruding at the side of the second display module 5*b*. In this regard, the casing 360 may include a pair of side surfaces 363 constructed such that the pair of casing guides 324 are inserted therebetween, and an upper surface 361 for connecting the pair of side surfaces 363 to each other and forming an outer appearance of the display control module 3. The pair of side surfaces 363 may be constructed such that a first side surface 363*a* having an inner surface on which the first casing guide 334*a* is disposed and the second side surface 363*b* having an inner surface on which the second casing guide 334*b* is disposed face each other.

The cover 323 may include a connection hole 320*h* extending therethrough. The connection interface 57 connected to the display module 5 may be connected to the PCB 330 via the connection hole 320*h*.

The PCB 330 may include a connection terminal 331, a board 332, and a connector 336. The connection interface 57 of the display module 5 may be electrically connected to the PCB 330 by being connected to the connection terminal 331 of the PCB 330. The connection terminal 331 may include a first connection terminal 331*a* connected to the first display module 5*a* and a second connection terminal 331*b* connected to the second display module 5*b*. The PCB 330 may be electrically connected to an adjacent PCB 330 via the connector 336. The PCB 330 may receive the power via the connector 336.

Figure 5:
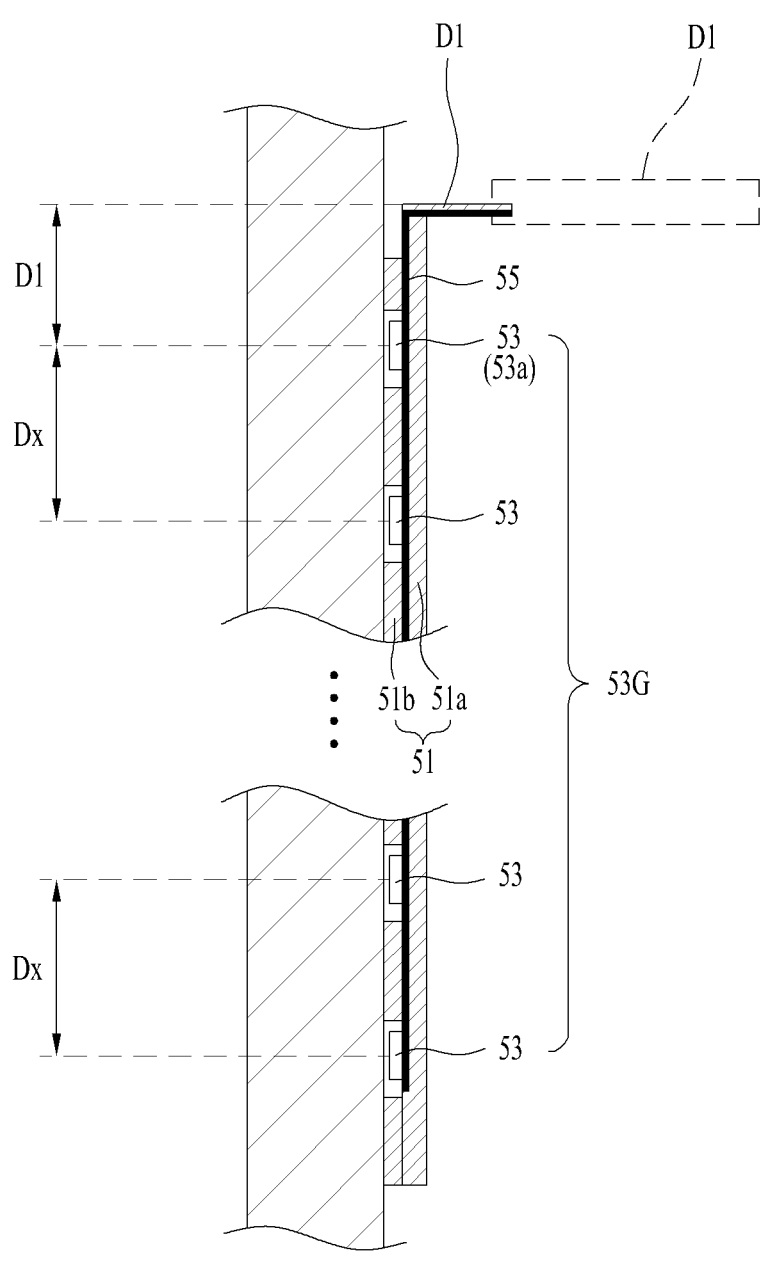
FIG. 5 is a cross-sectional view of S1-S1' in FIG. 2.

FIG. 5 is a cross-sectional view of S1-S1' in FIG. 2. Hereinafter, description of the same component refers to the description of the previous drawings.

The display module 5 may include the plurality of LEDs 53 on the film 51 so as to be spaced apart from each other by the preset spacing Dx. The film 51 may include a first layer 51*a* including circuit wiring 55 and a second layer 51*b* deposited on the first layer 51*a* and accommodating the LEDs 53 therein.

The circuit wiring 55 may be disposed between the first layer 51*a* and the second layer 51*b* and electrically connected to the LEDs 53. The circuit wiring 55 may be connected to the LEDs 53 belonging to the same LED array group 53G and may be connected to the connection interface 57 to receive voltage and the image signal from the PCB 330.

Figure 6:
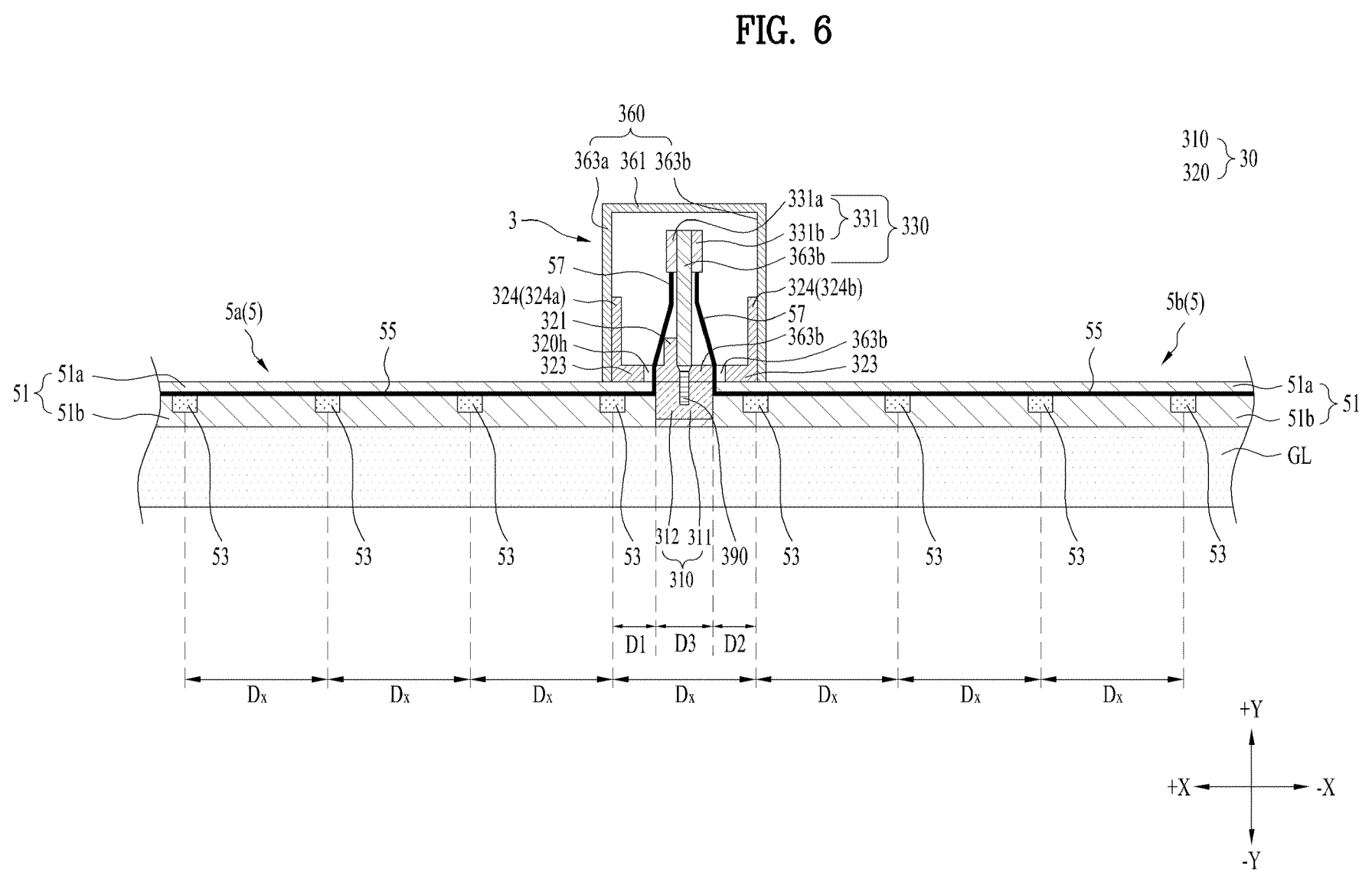

FIG. 6 is a cross-sectional view of S2-S2' in FIG. 2. Hereinafter, description of the same component refers to the description of the previous drawings.

The LEDs 53 disposed in the display module 5 may be arranged with the preset spacing Dx. The spacing Dx at which the LEDs 53 disposed in the first display module 5*a* are arranged may be the same as the spacing Dx at which the LEDs 53 disposed in the second display module 5*b* are arranged.

The display module 5 may be fixed to the display control module 3 such that each LED array group 53G disposed in the first display module 5*a* and each LED array group 53G disposed in the second display module 5*b* are located on the same line. With such connection structure, continuity of an image output from the first display module 5*a* and an image output from the second display module 5*b* may be increased.

The display module 5 may be constructed such that a spacing Do between an LED closest to the display control module 3 in the first display module 5*a* and an LED closest to the display control module 3 in the second display module 5*b* is equal to the preset spacing Dx. Specifically, a sum Do of a spacing D1 between the LED closest to the display control module 3 in the first display module 5a and the guide 310, a spacing D2 between the LED closest to the display control module 3 in the second display module 5b and the guide 310, and a width D3 of the guide 310 may be equal to the preset spacing Dx. Via such spacing relationship, the continuity of the image output from the first display module 5a and the image output from the second display module 5b may be increased.

The display device 1 may be directly attached to the exterior target surface GL. That is, the display device 1 may be attached such that a front surface of the display module 5 is in contact with the exterior target surface GL and the guide 310 of the display control module 3 is in contact with the exterior target surface GL. In the display module 5, the second layer 51b may have adhesiveness and thus be fixed in close contact with the exterior target surface GL. The guide 310 may include a guide body 311 constituting a body and an attachment member 312 disposed between the guide body 311 and the exterior target surface GL, so that the guide 310 may be fixed in close contact with the exterior target surface GL.

However, such close-contact structure is difficult to be installed on the exterior target surface GL of various structures. Thus, another embodiment of the display device 1 will be described below.

Figure 7:
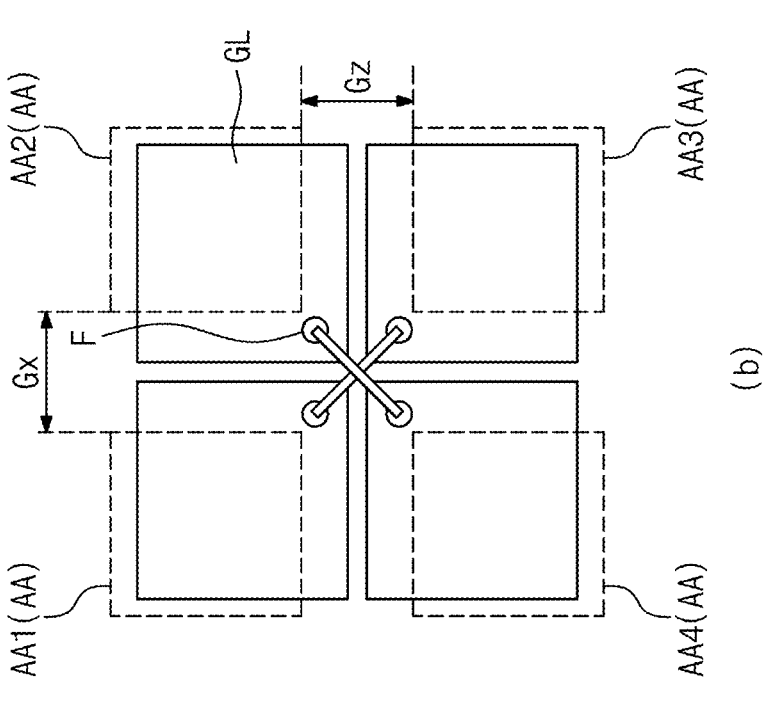
FIG. 7 shows an embodiment of an exterior target surface on which a display device is difficult to be installed.
Figure 7:
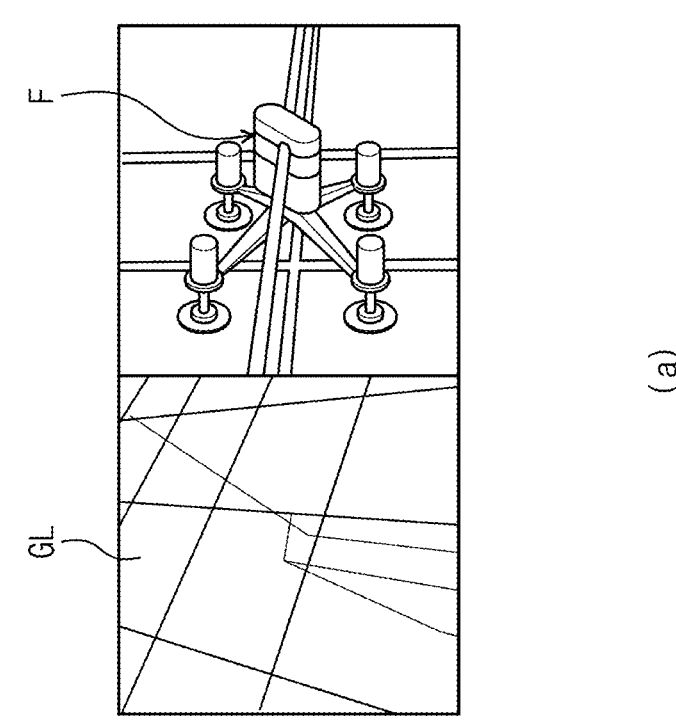

FIG. 7 shows an embodiment of an exterior target surface on which a display device is difficult to be installed.

(a) in FIG. 7 shows an embodiment in which the exterior target surface is a glass plate GL and the glass plates GL are installed so as to be connected to each other by a fixing frame F. (b) in FIG. 7 shows positions AA where the display device 1 may be in close contact with the exterior target surface formed by the glass plates GL and the frame F in (a) in FIG. 7.

When a whole glass outer wall is formed by connecting the glass plates GL to each other, the frame F for connecting the glass plates GL to each other is essential. In this regard, there may be various structures and shapes of the frame F. However, because the frame F usually protrudes inward from the whole glass outer wall, the display device 1 must be attached to the glass plate GL avoiding an area where the frame F is disposed.

An area where the display device 1 can be attached avoiding the area where the frame F is disposed may be difficult to be continuous. Specifically, the area AA where the display device 1 may be attached may be divided into four around the frame F. Areas AA1, AA2, AA3, and AA4 may be spaced apart from each other by certain spacings Gx and Gz corresponding to a size of the frame F.

The area AA to which the display device 1 can be attached is not continuous because of the frame F, which may be disadvantageous in outputting an entire continuous image. In addition, depending on the size and the shape of the frame F, the area AA to which the display device 1 can be attached may vary, so that there may be uneconomical characteristics where the shape and the size of the display device 1 need to be customized, which may become a problem.

To solve the above problem, it may be desirable that the display device 1 is disposed so as to be spaced apart from the exterior target surface by a certain spacing. Specifically, when the display device 1 is spaced apart from the exterior target surface by a distance corresponding to a thickness of the frame F, the problem that the display device 1 needs to be disposed avoiding the area where the frame F is disposed may be solved. Hereinafter, another embodiment of the display device 1 having the structure described above will be described.

Figure 8:
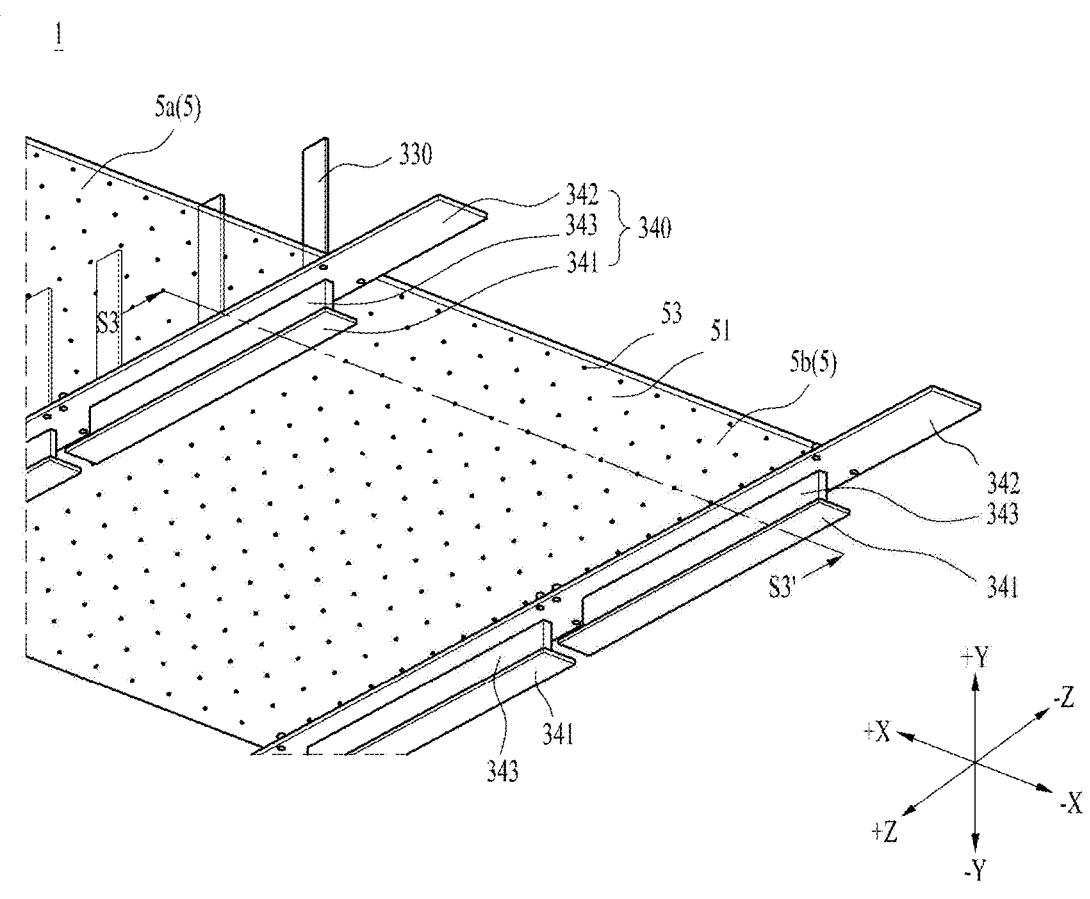
FIG. 8 is a perspective view of a display device according to another embodiment of the present disclosure.
Figure 9:
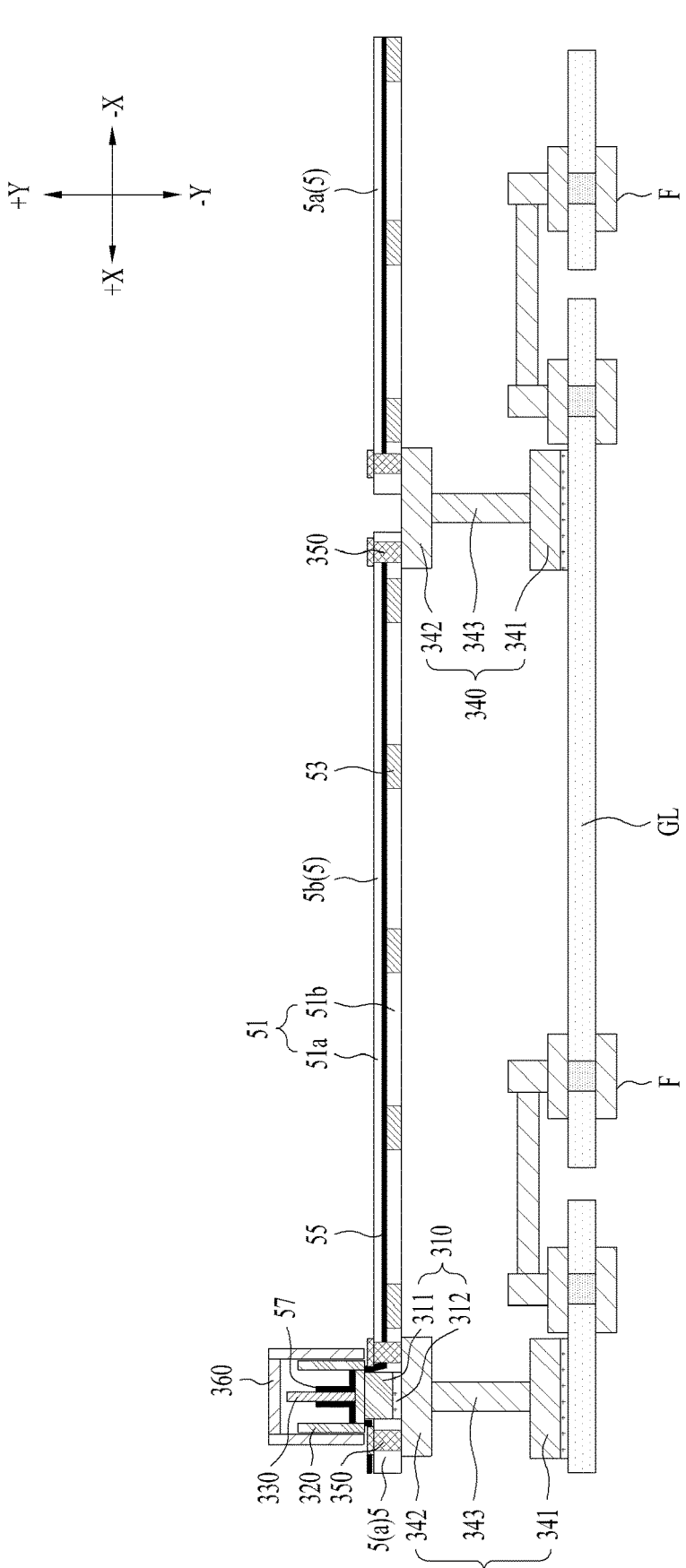
FIG. 9 is a cross-sectional view taken along a line S3-S3' in a state in which a display device is attached to an exterior target surface according to another embodiment of the present disclosure.

FIG. 8 is a perspective view of a display device according to another embodiment of the present disclosure. FIG. 9 is a cross-sectional view taken along a line S3-S3' in a state in which a display device is attached to an exterior target surface according to another embodiment of the present disclosure. Hereinafter, description of the same component refers to the description of the previous drawings.

The display device 1 may include a support member 340 having one end fixed to the exterior target surface GL, and the pair of display modules 5a and 5b fixed to the other end of the support member 340 with the support member 340 interposed therebetween. The display device 1 may include the PCB 330 disposed at the other end of the support member 340 to control at least one of the pair of display modules 5a and 5b.

The pair of display modules 5 may be spaced apart from the exterior target surface GL by being supported by the support member 340. A distance between the pair of display modules 5 and the exterior target surface GL may correspond to the thickness of the frame F supporting the exterior target surface GL. Specifically, the distance between the pair of display modules 5 and the exterior target surface GL may be greater than the thickness of the frame F.

The support member 340 may include a first fixing portion 341 forming the one end of the support member 340 and fixed to the exterior target surface, a second fixing portion 342 forming the other end of the support member 340 and to which the pair of display modules 5 are fixed, and a connecting portion 343 for connecting the first fixing portion 341 and the second fixing portion 342 to each other.

The connecting portion 343 may be a component that is assembled and fixed to each or at least one of the first fixing portion 341 and the second fixing portion 342. The connecting portion 343 may be manufactured to have a length corresponding to the thickness of the frame F. Depending on a case, the connecting portion 343 may be a component whose length is adjustable.

The support member 340 may be a component included in the display control module 3. Specifically, the support member 340 may be disposed so as to be in contact with the guide 310. The second fixing portion 342 of the support member 340 may be disposed so as to be in close contact with the guide 310. The second fixing portion 342 of the support member 340 may be disposed to be in contact with the pair of display modules 5 at both sides thereof with the guide 310 interposed therebetween.

The pair of display modules 5 may be fixed to the second fixing portion 342 with a fastening member 350. The fastening members 350 may be disposed along both edges of the second fixing portion 342. The pair of display modules 5 may be fastened to the second fixing portion 342 with the fastening member 350 with the guide 310 interposed therebetween.

The second fixing portion 342 may extend in one direction along the guide 310. Specifically, the guide 310 may be disposed between the pair of display modules 5 and extend in one direction. The pair of display modules 5 may be disposed in contact with one guide 310 along the one direction. The second fixing portion 342 may extend along one direction in which the guide 340 extends.

A plurality of first fixing portions 341 may be connected to one second fixing portion 342. Specifically, the plurality of first fixing portions 341 may be spaced apart from each other at a preset spacing along the one direction in which the second fixing portion 342 extends. The number of connecting portions 343 may correspond to the number of first fixing portions 341. The plurality of connecting portions 343 may connect the plurality of first fixing portions 341 to one second fixing portion 342, respectively.

The support member 340 may be made of metal or plastic. In some cases, the support member 340 may be made of a transparent material. The support member 340 may be made of the transparent material so as to be minimally recognized from the outside via the glass GL.

Figure 10:
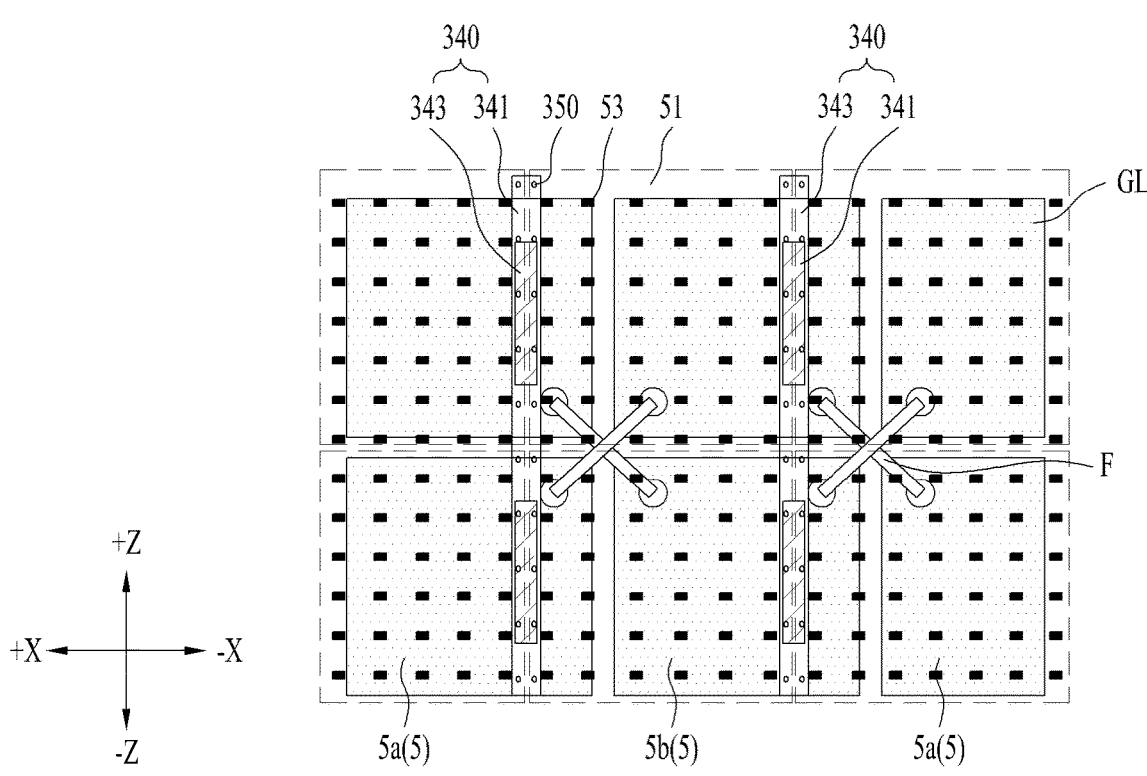
FIG. 10 is a front view of a state in which a display device is attached to an exterior target surface according to another embodiment of the present disclosure.

FIG. 10 is a front view of a state in which a display device is attached to an exterior target surface according to another embodiment of the present disclosure. Hereinafter, description of the same component refers to the description of the previous drawings.

The plurality of glasses GLs may be connected to each other via the frame F. The glass GL may be manufactured in a polygonal shape, and the frame F may connect the plurality of adjacent glasses GL to each other. The frame F may fix edges or corners of the plurality of adjacent glasses GL.

The display module 5 may be fixed to the surface of the glass GL by the support member 340. The display module 5 may be disposed to face the surface of the glass GL, and may output the image in the direction in which the glass GL is disposed. The display module 5 may be spaced apart from the surface of the glass GL via the support member 340. Specifically, the display module 5 may be spaced apart from the surface of the glass GL at a distance so as not come into contact with the frame F.

The support member 340 may fix the glass GL and the display module 5 to each other avoiding the frame F. In some cases, the support member 340 may fix the frame F and the display module 5 to each other.

The frame F may be disposed in an area between the plurality of glasses GL, so that it may not be unnatural to be exposed to the outside. Because the support member 340 is made of the transparent material, it may not be unnatural to be exposed to the outside. In some cases, the support member 340 may be disposed in the area between the plurality of glasses GL.

The display module 5 may be spaced apart from the surface of the glass GL and fixed to cover the frame F as well. That is, the display module 5 does not need to be installed avoiding the area where the frame F is disposed as described in (b) in FIG. 7. The plurality of display modules 5 may be continuously arranged on the surface of the glass GL to output an continuous image.

Figure 11:
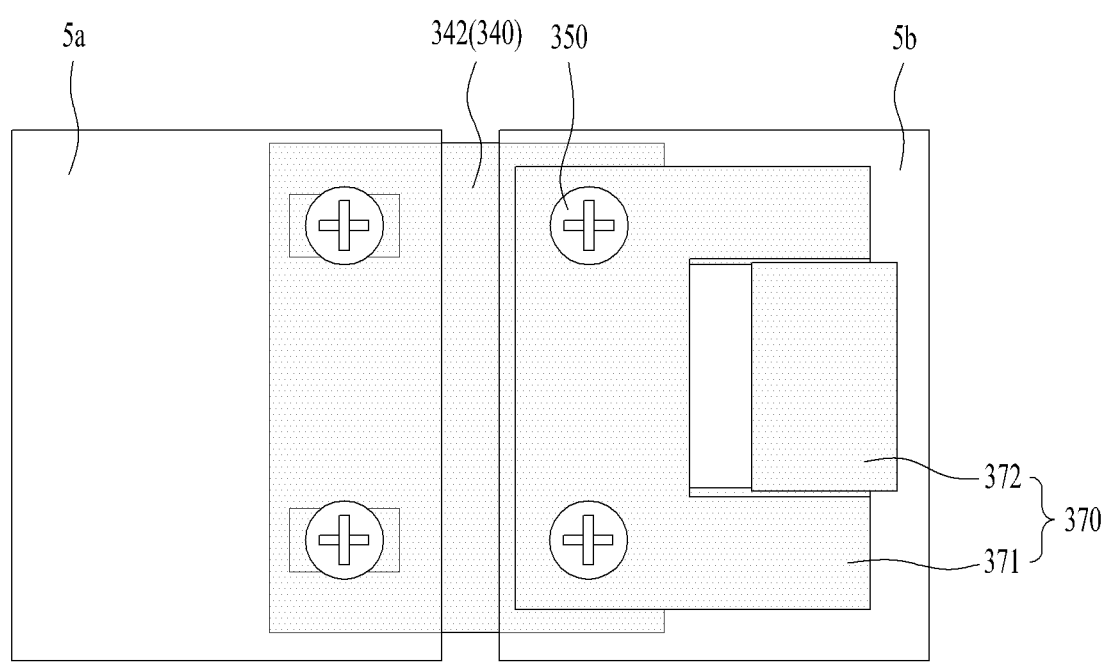
FIGS. 11 and 12 are diagrams for illustrating a first embodiment of a support member applicable to a display device according to another embodiment of the present disclosure.
Figure 12:
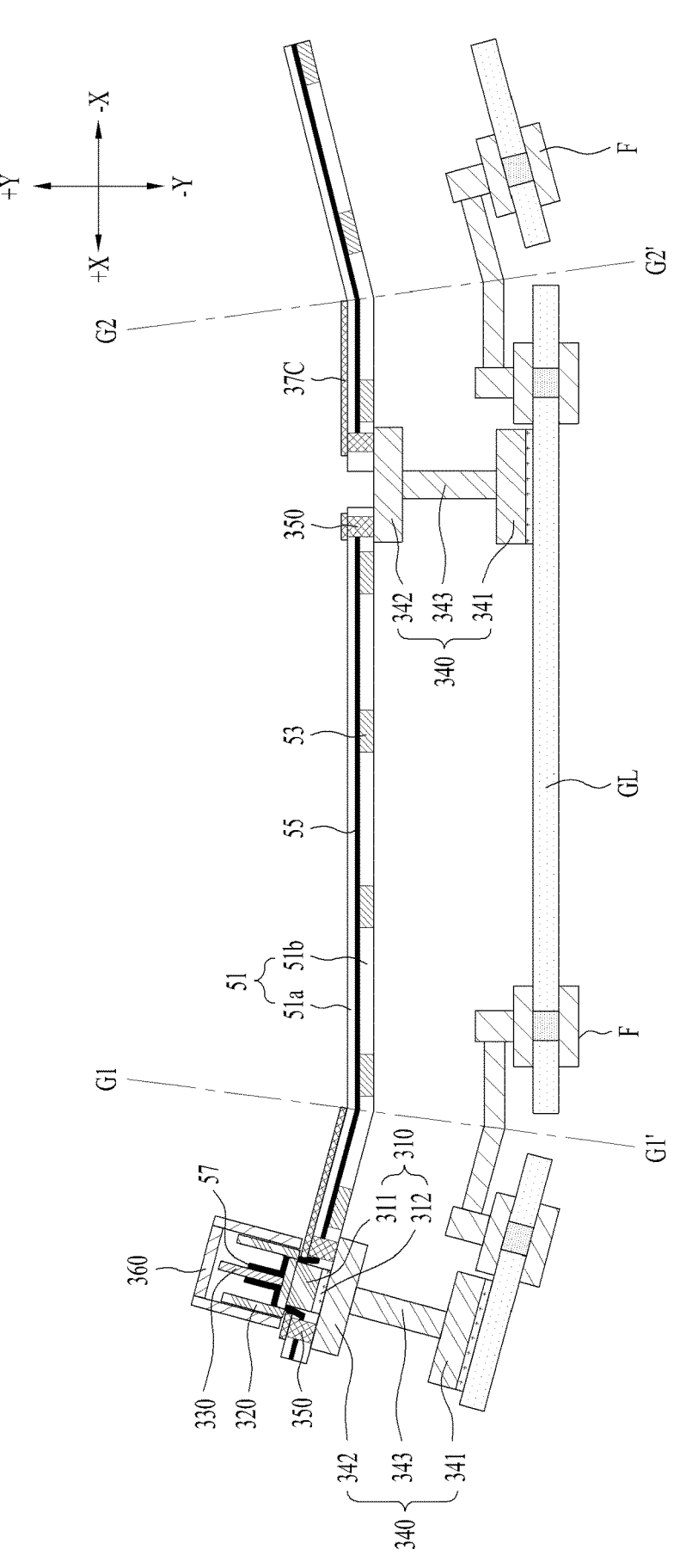

FIGS. 11 and 12 are diagrams for illustrating a first embodiment of a support member applicable to a display device according to another embodiment of the present disclosure. Hereinafter, description of the same component refers to the description of the previous drawings.

Specifically, FIG. 11 is an enlarged front view of the second fixing portion 342 of the support member 340, and FIG. 12 illustrates the display module 1 to which the support member 340 in FIG. 11 is coupled.

Referring to FIG. 10, the support member 340 may be disposed in an area avoiding the frame F. When the frame F connects the glasses GL to each other such that the plurality of glasses GL are flush with each other, the location of the support member 340 may not be a problem. However, when the frame F is connected such that the plurality of glasses GL form a predetermined angle, the location of the support member 340 may become a problem.

The plurality of glasses GL may form the predetermined angle around the frame F. The pair of display modules 5 may form the predetermined angle around the support member 340. In this regard, when the support member 340 is disposed adjacent to the frame F, and the support member 340 and the frame F are not disposed on the same axis G1-G1' or G2-G2', the pair of display modules 5 and the glass GL cannot be arranged to face each other.

The support member 340 may further include an extension member 370 that supports a rear surface of the display module 5 such that the display module 5 may form the predetermined angle with the glass GL on the same axis G1-G1' or G2-G2'.

The extension member 370 may be fixed to the second fixing portion 342 and extend to at least one of both sides where the pair of display modules 5 are respectively arranged. The extension member 370 may be disposed to support the rear surface of the display module 5. To this end, the extension member 370 may be connected to the fastening member 350 of the display module 5. In some cases, the extension member 370 may be connected to the base 320 or the guide 310.

The extension member 370 may include a first extension member 371 fixed to the support member 340 and a second extension member 372 that is connected to the first extension member 371 so as to be slidable in an extension direction of the first extension member 371. In some cases, the extension member 370 may further include a fixing member (not shown) for the second extension member 372 to be fixed to the first extension member 371 in the state of being slid.

Figure 13:
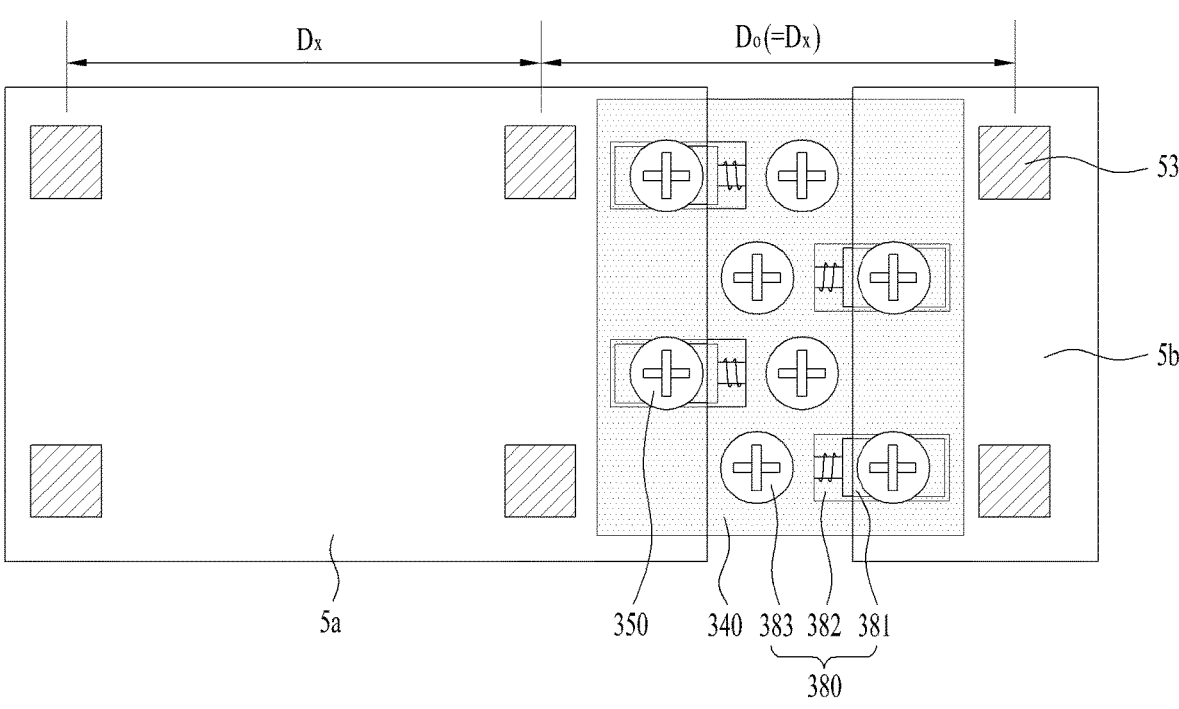
FIGS. 13 and 14 are views for illustrating a second embodiment of a support member applicable to a display device according to another embodiment of the present disclosure.
Figure 14:
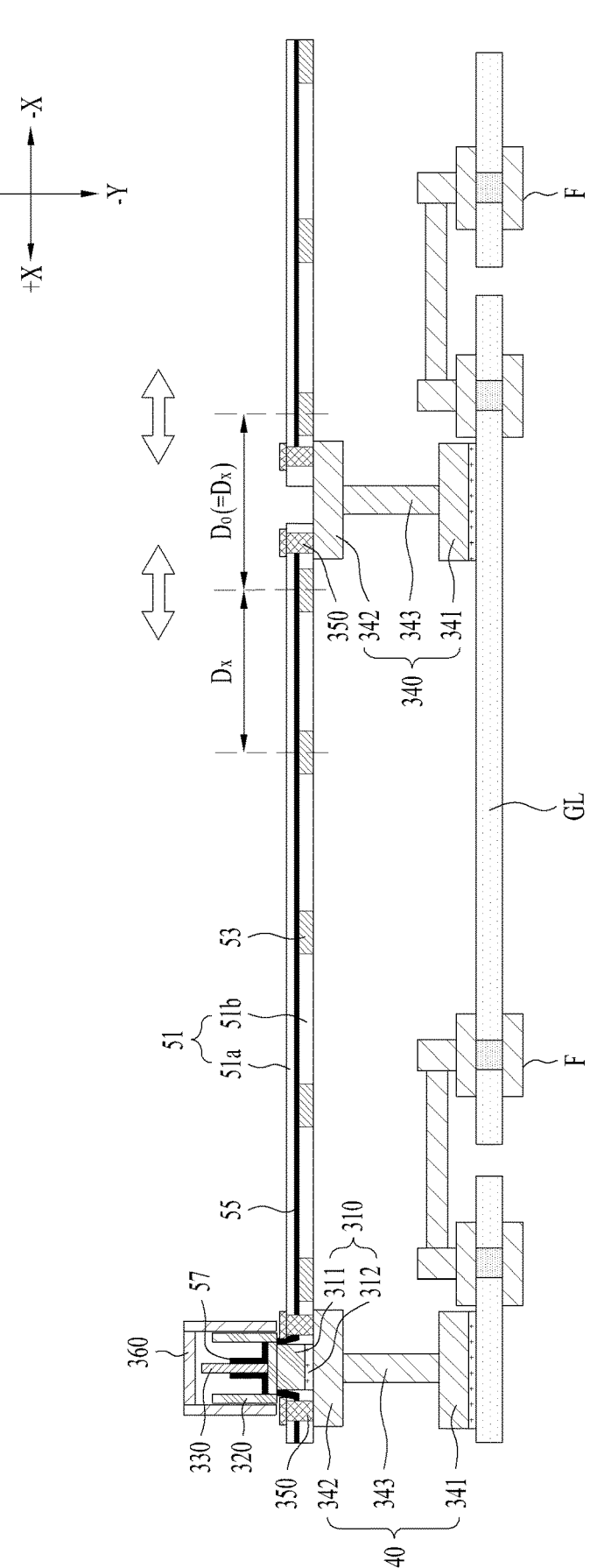

FIGS. 13 and 14 are views for illustrating a second embodiment of a support member applicable to a display device according to another embodiment of the present disclosure. Hereinafter, description of the same component refers to the description of the previous drawings.

Specifically, FIG. 13 is an enlarged front view of the second fixing portion 342 of the support member 340, and FIG. 14 illustrates the display module 1 to which the support member 340 in FIG. 13 is coupled.

The display module 5 may include the LEDs 53 at the preset spacing. The spacing Dx between the LEDs in the first display module 5a may correspond to the spacing Dx between the LEDs in the second display module 5b. In this regard, an LED column in the first display module 5a may be disposed on the same line as an LED column in the second display module 5b.

The spacing Do between the LED 53 closest to the support member 340 in the first display module 5a and the LED 53 closest to the support member 340 in the second display module 5b may be fixed on the support member 340 so as to correspond to the preset spacing Dx. The support member 340 may include spacing adjustment means 380 that adjusts the spacing between the first display module 5a and the second display module 5b, and may adjust the spacing between the first display module 5a and the second display module 5b.

In this regard, the support member 340 may have a width smaller than or equal to the spacing Dx between the LEDs 53, and may be defined within the spacing defined by the LEDs 53 so as not to overlap the LEDs 53.

The spacing adjustment means 380 may move the pair of display modules 5 along both sides where the pair of display modules 5 are respectively arranged. Specifically, the spacing adjustment means 380 may move the pair of display modules 5 along the same side or along opposite sides among the both sides.

The spacing adjustment means 380 may include fixing means 381 to which the display module 5 is fastened, moving means 382 guiding the fixing means 381 along the both sides, and tightening means 383 adjusting a moving distance of the fixing means 381. The tightening means 383 may adjust the moving distance along the both sides while the display module 5 is fixed to the fixing means 381 using the fastening member 350.

The spacing adjustment means 380 may prevent the display module 5 from wrinkling by pulling the display module 5 along one of the both sides while the display module 5 is fixed to the glass GL via the support member 340. That is, the spacing adjustment means 380 may adjust the spacing between the LEDs to be the preset spacing Dx or prevent the display module 5 from being wrinkled in fixing the display module 5 to the glass GL using the support member 340.

Figure 15:
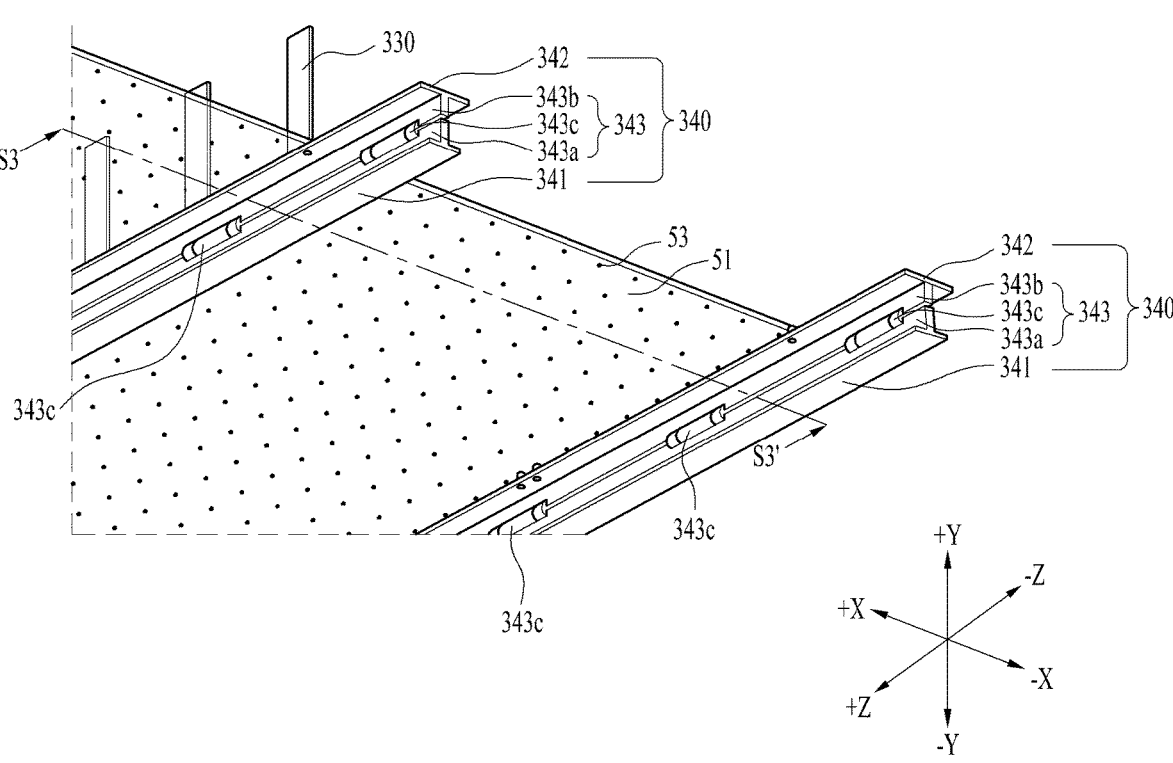
FIGS. 15 and 16 are views for illustrating a third embodiment of a support member applicable to a display device according to another embodiment of the present disclosure.
Figure 16:
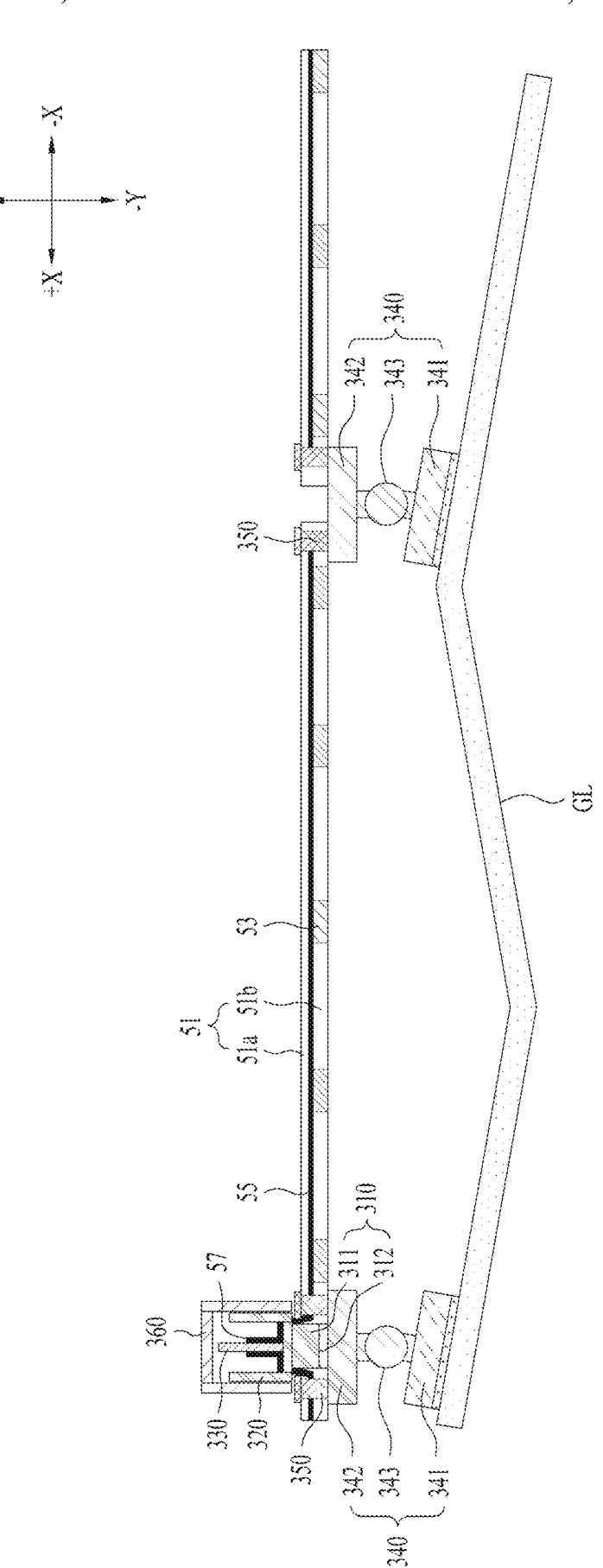

FIGS. 15 and 16 are views for illustrating a third embodiment of a support member applicable to a display device according to another embodiment of the present disclosure. Hereinafter, description of the same component refers to the description of the previous drawings.

When the exterior target surface GL to which the display module 5 is fixed does not form a plane, it may be difficult to fix the display module 5 based on a shape in which the exterior target surface GL is arranged. In this case, the display module 5 may be preferably fixed to the exterior target surface GL in a flat state.

The support member 340 may include a hinge portion 343c in the connecting portion 343 for connecting the first fixing portion 341 and the second fixing portion 342 to each other so as to support the display module 5 in the flat state based on the glasses GL connected to each other at various angles. The hinge portion 343c may change an angle formed by the first fixing portion 341 and the second fixing portion 342 such that the second fixing portion 342 supports the display module 5 in the plane state.

Specifically, the connecting portion 343 may include a first connecting portion 343a connected to the first fixing portion 341, a second connecting portion 343b connected to the second fixing portion 342, and the hinge portion 343c to which the first connecting portion 343a and the second connecting portion 343a are pivotably connected.

A plurality of hinge portions 343c may be disposed between the first connecting portion 343a and the second connecting portion 343b. Specifically, the plurality of hinge portions 343c may be arranged at the preset spacing along a direction in which the first connecting portion 343a and the second connecting portion 343b extend. In some cases, the hinge portion 343c may extend along the direction in which the first connecting portion 343a and the second connecting portion 343b extend.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

12

What is claimed is:

1. A display device comprising:
   a support member having a front end fixed to an exterior target surface, the support member extending along a first direction and including transparent material;
   a pair of display modules having a front surface outputting an image and a front edge fixed to a rear end of the support member, the pair of display modules being disposed along a second direction perpendicular to the first direction; and
   a printed circuit board (PCB) disposed at the rear end of the support member to control at least one of the pair of display modules,
   wherein the pair of display modules are supported by the support member to be spaced apart from the exterior target surface.

2. The display device of claim 1, wherein the support member includes:
   a first fixing portion forming the front end of the support member and fixed to the exterior target surface;
   a second fixing portion forming the rear end of the support member, wherein the pair of display modules are fixed to the second fixing portion; and
   a connecting portion for connecting the first fixing portion and the second fixing portion to each other.

3. The display device of claim 2, wherein the second fixing portion includes an extension member extending along at least one of both sides so as to support rear surfaces of the pair of display modules fixed to the second fixing portion.

4. The display device of claim 2, wherein the second fixing portion includes spacing adjustment means for adjusting a spacing between the pair of display modules fixed to the second fixing portion.

5. The display device of claim 4, wherein the spacing adjustment means include:
   fixing means to which the display module is fastened,
   moving means guiding the fixing means along the both sides, and
   tightening means adjusting a moving distance of the fixing means.

6. The display device of claim 2, wherein the connecting portion further includes a hinge portion capable of changing an angle formed by the first fixing portion and the second fixing portion.

7. The display device of claim 2, wherein the second fixing portion extends in one direction, wherein each pair of display modules are fixed to each second fixing portion along the one direction.

8. The display device of claim 7, wherein the first fixing portion includes a plurality of first fixing portions along the one direction of the second fixing portion.

9. The display device of claim 1, wherein the pair of display modules include a plurality of LEDs arranged to be spaced apart from each other at a preset spacing, wherein the support member has a width smaller than or equal to the preset spacing.

10. The display device of claim 9, wherein the pair of display modules include:
    a first display module disposed on one side of the rear end of the support member; and
    a second display module disposed on the other side of the rear end of the support member,
    wherein a spacing between an LED closest to the support member in the first display module and an LED closest to the support member in the second display module is the preset spacing.

11. A display control module comprising:

a support member having a front end configured to be fixed to an exterior target surface and a rear end fixed to a front edge of a pair of display modules, the support member extending along a first direction and including transparent material; and a printed circuit board (PCB) disposed at the rear end of the support member to control at least one of the pair of display modules, wherein the support member supports the pair of display modules to be spaced apart from the exterior target surface.

12. The display control module of claim 11, wherein the support member includes:

a first fixing portion forming the front end of the support member and fixed to the exterior target surface;

a second fixing portion forming the rear end of the support member, wherein the pair of display modules are fixed to the second fixing portion; and a connecting portion for connecting the first fixing portion and the second fixing portion to each other.

13. The display control module of claim 12, wherein the second fixing portion includes an extension member extending along at least one of both sides so as to support rear surfaces of the pair of display modules fixed to the second fixing portion.

14. The display control module of claim 12, wherein the second fixing portion includes spacing adjustment means for adjusting a spacing between the pair of display modules fixed to the second fixing portion.

15. The display control module of claim 12, wherein the connecting portion further includes a hinge portion capable of changing an angle formed by the first fixing portion and the second fixing portion.

16. The display control module of claim 12, wherein the second fixing portion extends in one direction, wherein each pair of display modules are fixed to each second fixing portion along the one direction.

17. The display control module of claim 16, wherein the first fixing portion includes a plurality of first fixing portions along the one direction of the second fixing portion.

* * * * *